United States Patent
Johansson (10) Patent No.: US 7,420,321 B2
(45) Date of Patent: Sep. 2, 2008

(54) HEAT EFFICIENT MICROMOTOR

(75) Inventor: Stefan Johansson, Uppsala (SE)

(73) Assignee: Piezomotor Uppsala AB, Uppsala (SE)

( * ) Notice: Subject to any disclaimer, the term of this patent is extended or adjusted under 35 U.S.C. 154(b) by 83 days.

(21) Appl. No.: 11/366,519

(22) Filed: Mar. 3, 2006

(65) Prior Publication Data

US 2007/0205699 A1   Sep. 6, 2007

(51) Int. Cl.
*H01L 41/00* (2006.01)
(52) U.S. Cl. .................. 310/365; 310/311; 310/316.01; 310/332
(58) Field of Classification Search ................. 310/311, 310/316.01, 323.01, 332
See application file for complete search history.

(56) References Cited

U.S. PATENT DOCUMENTS

| | | | |
|---|---|---|---|
| 6,066,911 A | | 5/2000 | Lindemann et al. |
| 6,184,609 B1 * | | 2/2001 | Johansson et al. ........... 310/328 |
| 6,379,510 B1 * | | 4/2002 | Kane et al. ............. 204/192.34 |
| 6,407,482 B2 * | | 6/2002 | Sakata et al. ................. 310/328 |
| 6,437,485 B1 * | | 8/2002 | Johansson ................... 310/332 |
| 2005/0120552 A1 * | | 6/2005 | Silverbrook ................. 29/856 |
| 2005/0170637 A1 * | | 8/2005 | Chou ........................ 438/626 |
| 2005/0179343 A1 | | 8/2005 | Johansson et al. |

* cited by examiner

*Primary Examiner*—Darren Schuberg
*Assistant Examiner*—Bryan P Gordon
(74) *Attorney, Agent, or Firm*—Young & Thompson (57) ABSTRACT

An electromechanical actuator comprises at least two actuating portions of electromechanically active material extending by a generally elongated shape from a back portion. The actuating portions are bimorphs, attached by a first end to a first side of the back portion and positioned parallel to each other one after the other in a first direction. The bimorphs are arranged to provide movements of the second end along the first direction and along the extension of the actuating portion, thereby being able to move relative a body in the first direction. The actuating portions have generally flat internal electrode layers arranged inside the electromechanically active material directed substantially perpendicular to the first direction. The internal electrode layers extend continuously through the actuating portions and into the back portion.

14 Claims, 7 Drawing Sheets

HEAT EFFICIENT MICROMOTOR

TECHNICAL FIELD

The present invention relates in general to electromechanical micromotors, and in particular to such micromotors using a plurality of actuating portions of electromechanically active material to create a relative motion.

BACKGROUND

There are numerous applications with the need for extremely miniaturized motors that are able to make controlled fine positioning. For example, in consumer products extremely small, low weight, low power consumption and inexpensive motors are typically requested. The motion range is often in the order of millimeters and with an accuracy of micrometers.

Many of the micromotors are based on the actions of electromechanically active materials. A geometrical volume or shape change is achieved by applying some kind of electrical signals. Most common of such materials are piezoelectric materials.

There are numerous of approaches of electromechanical motors concerning the geometrical configuration and drive principles. One group of electromechanical motors utilizes resonant properties of the actuators and/or the body to be moved. Other motors use different kinds of quasi static driving principles, where at least some of the actuators are in static mechanical contact with the body to be moved during at least a part of a driving cycle. In general, resonant motors tend to be more power efficient, while the quasi static motors tend to have a higher positioning precision.

One particular geometric configuration that has proven to be useful in many applications comprises at least two actuating portions arranged essentially perpendicular to an interaction surface of the body to be moved. The actuating portions are arranged to be possible to move in at least a two-dimensional plane, perpendicular to the interaction surface of the body to be moved. The actuating portions are moved in an alternating fashion, creating a walking or stepping motion. One typical example of such a motor is presented in the published US patent application 2005/0179343 or references therein. Other example can be found e.g. in the German patent DE 44 08 618 or the U.S. Pat. No. 6,066,911.

The German patent DE 44 08 618 excites the actuating portions by electrodes evaporated on the sides of the piezoelectric material of the actuating portions. When applying a voltage across the piezoelectric material, the thickness of the piezoelectric material changes. As a consequence thereof, since the volume of the piezoelectric material essentially is constant, the piezoelectric material also changes the length of the actuating portion. By being able to activate two different parts of the actuating portion, crating a bimorph structure, the required motion can be achieved. The useful dimension change is created perpendicular to the applied voltage, denoted as a d31 excitation. Traditionally, this excitation has been considered as less power efficient, since a smaller dimension change, roughly 50%, is achieved in this direction compared to the direction of the applied electric field.

d31 excitation has also been used, e.g. in "Characteristics of a piezoelectric miniature motor" by M. Bexell et al., in Sensors an Actuators 75 (1999) pp. 118-130. d31 Actuator elements were mounted on a silicon wafer in a circle configuration for rotating a rotor. The actuator elements were contacted to conductors provided in the silicon wafer. The configuration was successfully operated, however, such construction relying on precision mounting is not very suitable for large volume production.

In the U.S. Pat. No. 6,066,911, a d33 excitation has instead being used. There, the dimension change parallel to the applied field has been utilized by placing electrodes of the piezoelectric material parallel to the interaction surface. By providing electrodes covering different parts of the actuating portion cross section, the required two-dimensional motion has been obtained. Furthermore, by providing electrodes inside the piezoelectric volumes, lower excitation voltages can be used to achieve a certain dimension change. A similar basic motion idea is also used in the published US patent application 2005/0179343.

When providing electrodes inside the actuating portion, considerations regarding the electrode edges have to be made. If the electrodes are permitted to extend all the way out to the side surface of the actuating portion, mechanical strength problems typically occur. The actuating portions tend to crack at the interface between the piezoceramic and the electrode. Furthermore, the actuator portions typically have to be provided with some electrically insulating and chemically protecting layer, in order to avoid electrical problems and corrosion of the electrodes. These problems are typically solved by providing the actuating portions with electrode-free volumes closest to the surface, i.e. letting the electrodes end at some distance to the surface of the actuating portion.

SUMMARY

A general problem with prior art electromechanical actuator devices, in particular devices using internal electrodes, is that a zone of electromechanical material not possible to activate is created at the surfaces of the actuating portions. These "dead" zones will decrease the volume that actively can contribute to the motion and furthermore counteract any deformation. The efficiency of the excitation is thereby severely reduced, giving rise to large heat generation.

A general object of the present invention is to provide improved electromechanical actuators. A further object of the present invention is to reduce or rearrange volumes of electromechanical material that cannot be excited. Yet a further object of the present invention is to improve heat conduction in electromechanical actuators. Yet another further object is to enable a secure contacting suitable for production of large number of devices.

The objects mentioned above are solved by devices according to the enclosed patent claims. In general words, an electromechanical actuator comprises at least two actuating portions of electromechanically active material extending by a generally elongated shape from a back portion. The two actuating portions and the back portions are integrated as one common piece. The actuating portions are bimorphs, attached by a first end to a first side of the back portion and positioned parallel to each other one after the other in a first direction. The bimorphs are arranged to provide movements of the second end, i.e. the actuating portion tip, along the first direction and along the extension of the actuating portion, thereby being able to move relative a body in the first direction. The actuating portions have generally flat internal electrode layers arranged inside the electromechanically active material directed substantially perpendicular to the first direction. The internal electrode layers extend over a major part of the actuating portion and into the back portion, thereby creating continuous heat paths through the actuating portion and back portion. The internal electrode layers preferably comprise contacting portions at a surface of the back portion, i.e.

In preferred embodiments, at least one of the internal electrode layers extends over essentially the entire distance between the second end of the actuating portion and a second side of the back portion, opposite of the first side. The contacting portions of the internal electrode layers are furthermore arranged in thermal contact with a heat conductor. In a presently preferred embodiment, the internal electrode layers are entirely surrounded by the electromechanically active material within the actuating portion. A surface layer of electromechanically active material is provided outside the outermost internal electrode layer, having a preferred thickness of below 100 micrometers. However, also surface electrode layers can be utilized.

One advantage with the present invention is that it is possible to provide actuators possible to excite with lower power. This in turn leads to lower heat generation within the actuators. Furthermore, the configuration of the actuators also allows for improvements of heat conduction as well as for reliable manufacturing.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
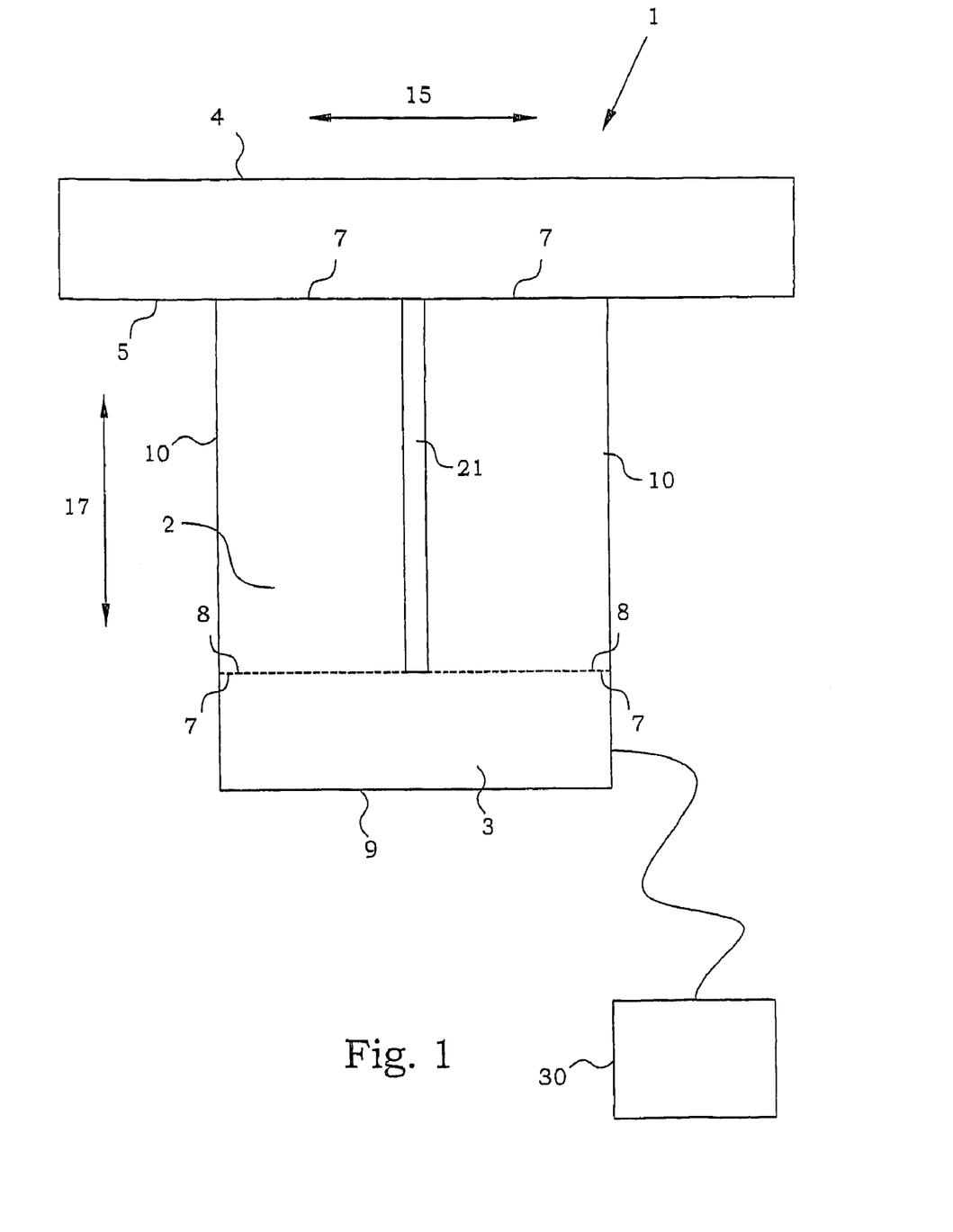
FIG. 1 illustrates a typical configuration of a "leg" actuator.

FIG. 1 illustrates schematically an electromechanical motor 1 operating via a multitude of electromechanical actuating portions 10 of an electromechanical actuator 2. The actuating portions 10 are extending by a generally elongated shape from a back portion 3. An interaction surface 5 of a body to be moved 4, is arranged in mechanical contact with the electromechanical actuator 2. Typically, the body to be moved 4 and the electromechanical actuator 2 are kept in contact by spring means (not shown). Control electronics 30 is connected to the electromechanical actuator 2 for supplying electrical signals that is used to activate electromechanically active material within the actuating portions 10. The actuating portions 10 are arranged as bimorphs, attached by a first end 6 to a first side 8 of the back portion 3 and positioned parallel to each other one after the other in a first direction 15. The actuating portions are placed at a small distance with respect to each other, leaving at least a small slit 21 in-between. The slit 21 is typically non-filled, but may in special applications be filled with a soft material not restricting any motion of the actuating portions 10 in any substantial degree. The actuating portions 10 and the back portion 3 are manufactured as one single integrated body. The bimorphs are arranged to provide movements of the second end 7, i.e. the actuating portion tip, along the first direction 15 and along the extension 17 of the actuating portion 10. The body to be moved 4 can thereby be given a motion in the first direction 15 relative to the electromechanical actuator 2. The electromechanical actuator 2 performs "steps" with its "legs" constituted by the actuating portions 10.

Figure 2A:
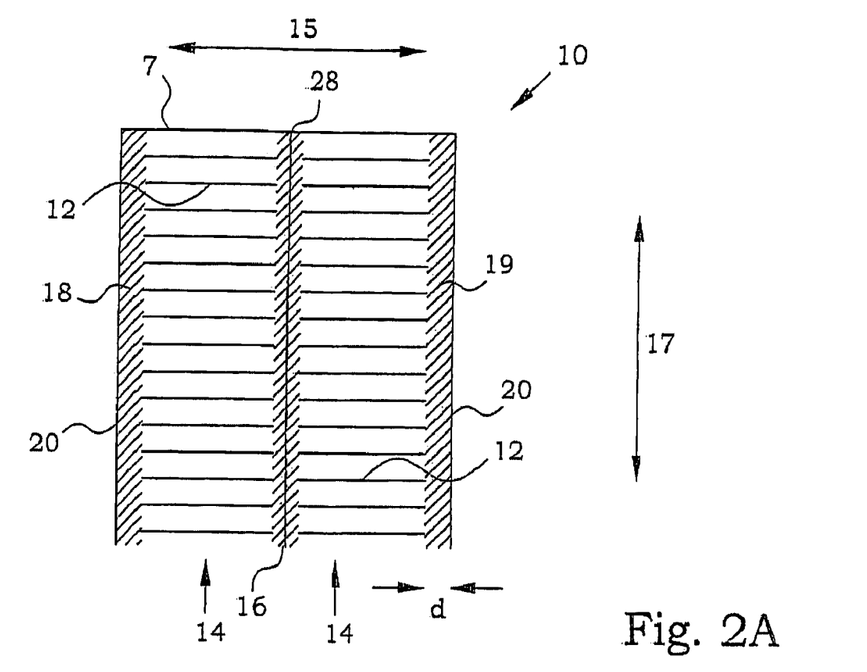
FIGS. 2A-D illustrates the impact of different "dead" zones in actuators.

FIG. 2A illustrates schematically the seriousness of the zones of non-activatible material in prior art actuating portions 10. A cross section along the extension of a typical actuating portion 10 is shown. In this example, internal electrodes 12 are provided side by side in two sections 14, in order to form a bimorph structure of actuating portion 10. A "dead" zone 16 appears in the middle of the actuating portion 10, and other "dead" zones 18, 19 appear in the vicinity of the side surfaces 20 of the actuating portion 10. These "dead" zones are volumes of electromechanical material, e.g. piezoceramic material, which cannot be excited or activated by use of the internal electrodes 12. The distance d from the side surface to the outermost part of the internal electrodes is typically determined by manufacturing requirements. In a typical actuator, the electrodes and electromechanical material are provided using screen print techniques. Such patterning can provide structures within the plane down to typically 150-200 µm, i.e. a minimum thickness of the dead zones 16, 18, 19 is typically in the order of 150-200 µm.

Figure 2B:
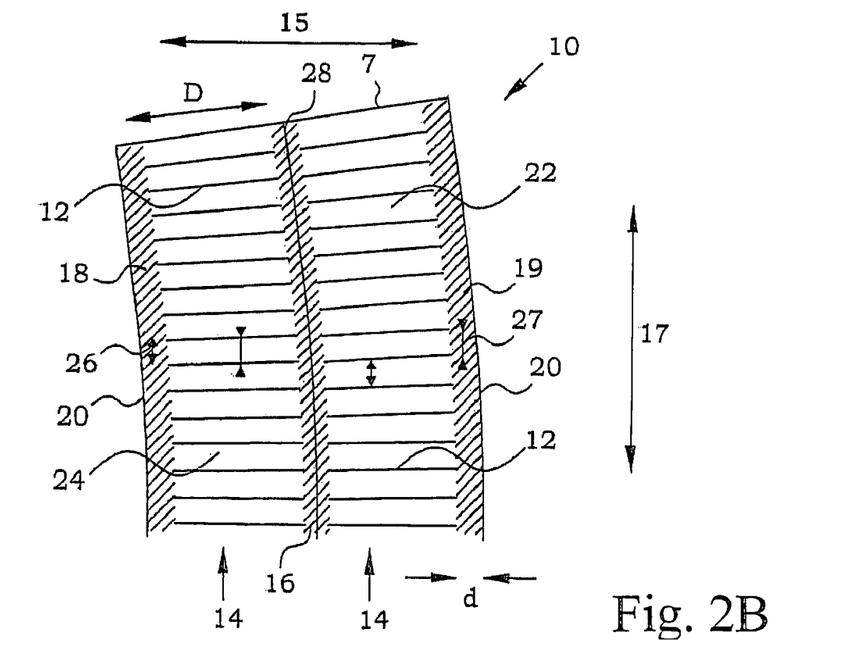

In FIG. 2B, voltages are provided across the internal electrodes 12. The voltages are applied in such a manner that the thickness of the electromechanical material 22 between the internal electrodes 12 at right side is forced to expand, whereas the thickness of the electromechanical material 24 between the internal electrodes 12 at left side is reduced. This causes a tilting of the entire actuating portion 10 that can be used for creating motions. This bilayer arrangement, i.e. a bimorph, is advantageous in small motors since the bending movement is magnified in relation the shape change of the material. A similar effect is achieved when voltage are applied so that only one side of the bilayer changes shape. However, in order to allow a tip of the actuating portions 10 to move along the surface of the body to be moved as well as along the extension of the actuating portions 10, both bilayer sides have to present shape changes. The tilting is extremely exaggerated in the figure to better illustrate the discussed effects.

The dead zones 16, 18, 19 do not contribute to the tilting. At the contrary, they counteract the tilting. The dead zones 18, 19 in the vicinity of the sides 20 are either compressed or stretched. When e.g. a piezoelectric material is exposed for compressing or stretching forces, an internal voltage is built up in the material that counteracts the compressing or stretching forces, illustrated by the arrows 26 and 27, respectively. Mechanically this is described with a higher elastic modulus for the material that has no internal electrodes with a controlled voltage. These forces therefore act in the opposite direction to the forces created by the applied voltage.

Furthermore, since the dead zones 18, 19 in the vicinity of the sides 20 are positioned at a distance D from the symmetry line 28 of the actuating portion 10, the counter-tilting effect will be larger than the tilting effect of an active volume of corresponding width d. This is due to that the strain maximum will be in the dead zones 18, 19. The position of the dead zones 18 and 19 are therefore the worst possible. The dead zone 16 in the middle of the actuating portion 10 does also counteract the tilting. However, the position of the dead zone 16 at the symmetry line 28 makes the influence of this dead zone 16 almost negligible. The extra power required for overcoming the counteracting function of the dead zones will be emitted as additional heat within the actuating portion 10, giving rise to heat problems. In order to make the tilting more efficient, the active sections 22, 24 of the actuating portion 10 have to be provided closer to the sides 20. With present manufacturing techniques, the width d is in the order of 150-200 μm, whereas the distance D in a small motor may be in the order of 1-2 mm. Simple estimations give that the efficiency in many cases may be reduced by 50% or even more.

Figure 2C:
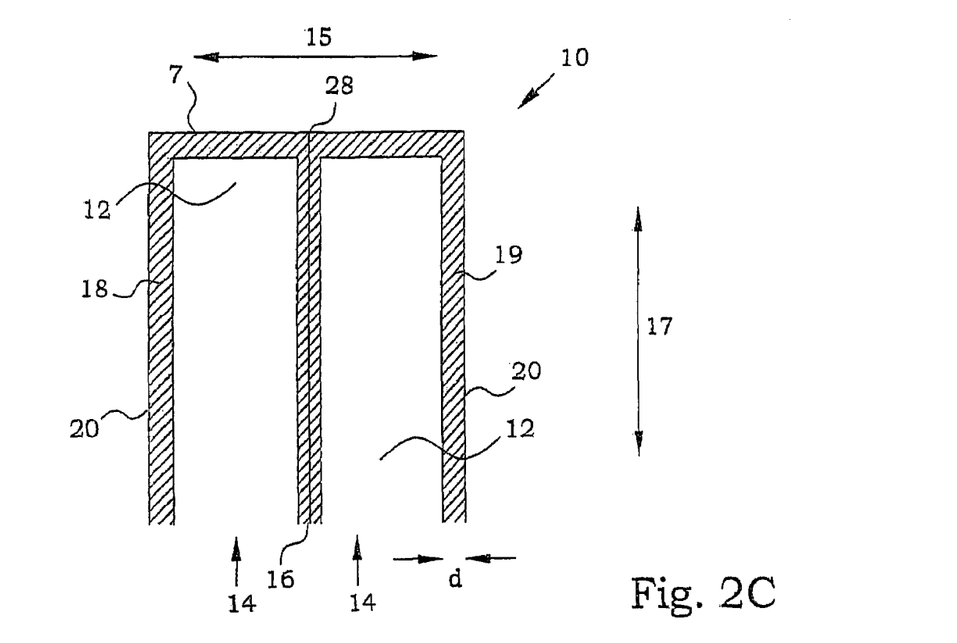

FIG. 2C illustrates a similar case, where the internal electrodes 12 instead are provided along the actuating portion 10. Also here, there has to be dead zones provided close to the sides 20, which also here reduces the available efficiency. In this case, the d31 excitation is furthermore used, which further decreases the efficiency.

Figure 2D:
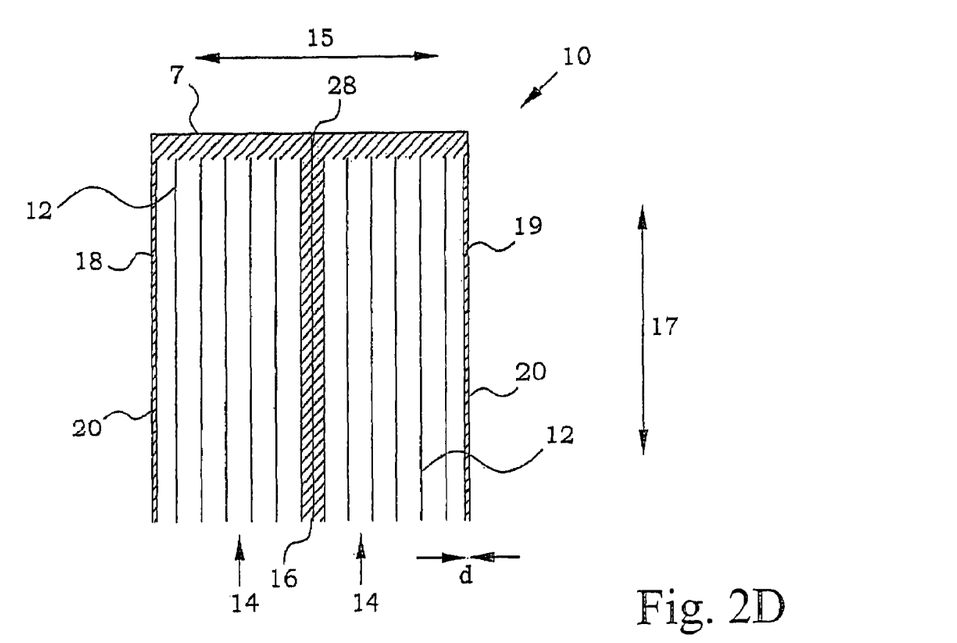

According to the present invention, as illustrated in FIG. 2D, dead zones 18, 19 close to the sides 20 in the tilting direction 15 of the actuating portion 10 are reduced in size, by providing internal electrodes 12 perpendicular to the tilting direction 15, i.e. the direction in which a body in contact with the actuator is to be moved. Since the internal electrodes 12 are provided in this direction, the building up of the actuating portion is performed in the same direction. This means that the limitations of structuring within the plane during manufacturing only are applicable in a direction perpendicular to the plane of the paper in FIG. 2D.

The thickness of the electromechanical material provided before, between and after the electrodes is controlled by other manufacturing properties. Thicknesses below 100 μm are to prefer, and thicknesses limited to 10-20 μm are even feasible by use of sacrificial material techniques as discussed further below. This leads to that the dead zones are more or less completely removed from the sides in the tilting direction, where the counteracting effect is the most severe one. Dead zones may instead appear sides parallel to the tilting direction, but there, the counteracting effect is much smaller. The proposed geometry of the electrodes implies that the excitation of the bending motion depends on the d31 expansion/contraction, which, as discussed in the background, is smaller than the d33 expansion/contraction.

It has been noticed that the movement of the d31 legs in relation to the d33 legs is much better than what would be expected from the relation between the piezoelectric coefficients, even when the effects from the dead zones are compensated for. There are several factors that improve the bending of the d31 legs. One important factor is that the strain in the 2- and 3-directions will be highly restricted close to the back portion 3. Since the material can be considered more or less incompressible, the restriction of motion in the 2- and 3-directions will result in a strain increase in the 1-direction which gives an improved bending. However, in many applications, the benefit of the reduced dead zones will anyway more than compensate the lower d31 coefficient in relation to the d33 coefficient.

Another important parameter in a piezoelectric motor of this kind is the stiffness of the legs. The d31 legs have a higher elastic modulus than d33 legs and this will in practice mean that they can handle higher loads.

It is also possible to provide an external electrode layer at the very surface of the actuating portion, thereby removing any dead volumes from the sides. In such a case, a signal electrode has to be protected both electrically and chemically, which makes the manufacturing slightly more complex. Preferably external electrodes should be connected as ground electrodes since the need for protection is less.

Figure 3:
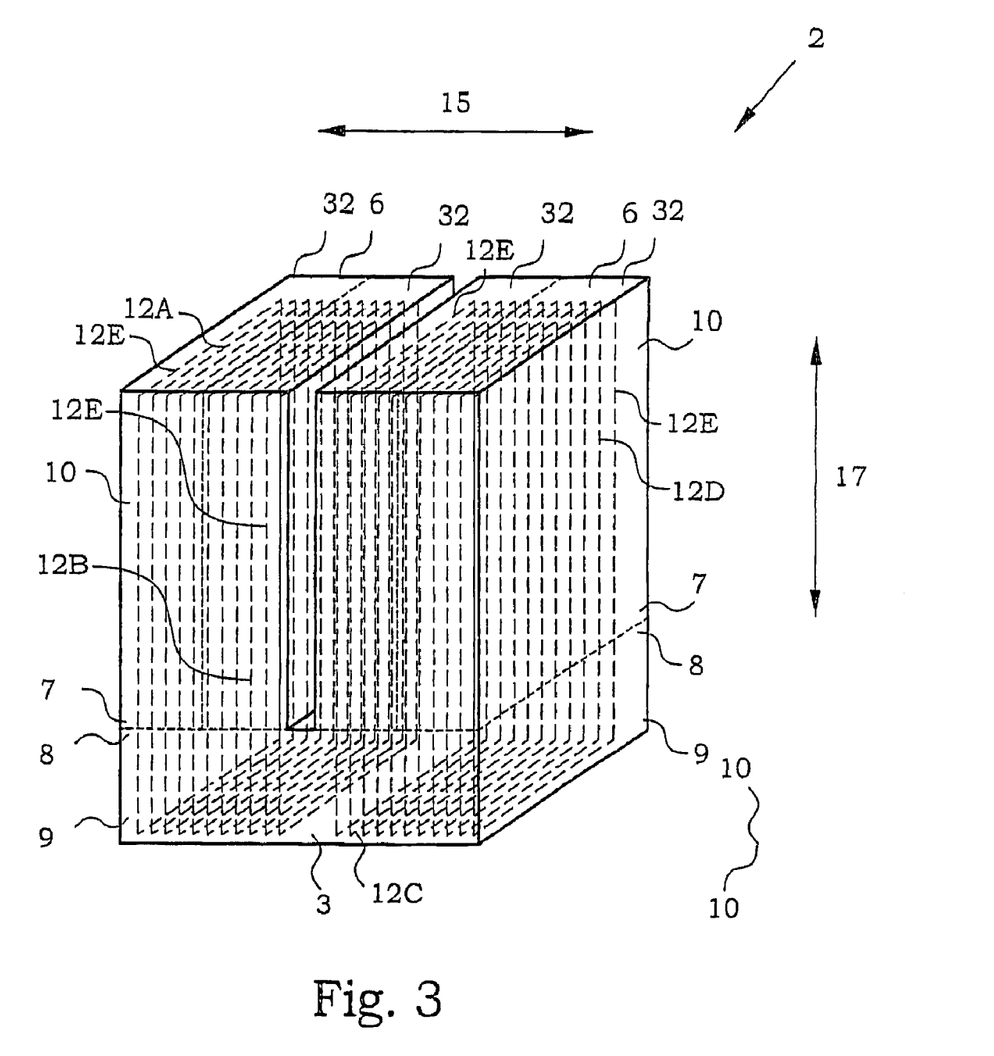
FIG. 3 is a schematic drawing of an embodiment of an internal electrode configuration according to the present invention.

FIG. 3 illustrates an embodiment of an internal electrode arrangement according to the present invention. An electromechanical actuator 2 comprises a back portion 3 and two actuating portions 10 of electromechanically active material. More than two actuating portions 10 may also be used in other embodiments. The actuating portions 10 have a generally elongated shape, forming "legs" extending along a direction 17 from the back portion 3. The actuating portions 10 are attached by a first end 7 to a first side 8 of the back portion 3. Preferably, the actuating portions 10 and the back portion 3 are manufactured as integrated in one single body. The second, or bottom, side of the back portion 3 is typically arranged for supporting against some housing. A second end 6 of the actuating portions 10 forms the tip with which the electromechanical actuator 2 drives a body. The two actuating portions 10 are positioned parallel to each other one after the other in a first direction 15. This first direction 15 is the direction in which the body to be moved is moved. In other words, the actuating portions 10 are placed after each other in the motion direction of the actuator 2.

The actuating portions 10 are provided by internal electrode layers arranged inside the electromechanically active material for activating the same. The internal electrode layers 12A-E have a generally flat two-dimensional shape directed substantially perpendicular to the first direction 15. The internal electrode layers are grouped in two groups 32 in each actuating portions 10. These groups are allowed to be excited individually, which forms a bimorph structure. In a typical case, internal electrodes 12 in each group 32 comprise alternating ground electrodes 12E and excitation electrodes 12A-D. By providing different voltage signals to the excitation electrodes, the four bimorph sections 32 can be excited individually. The outermost electrodes in each actuating portion 10 are in the present embodiment excitation electrodes 12A-D and are covered with a very thin layer of the same type of electromechanical material as used in the active volumes.

In the present embodiment, the internal electrode layers 12A-E extend over a major part of the electromechanical actuator 2, i.e. over most of the distance between the tip 6 of the actuating portions 10 and the second side 9 of the back portion 3. Since the electrode layers 12A-E are good heat conductors, and since the electrode layers are continuous layers, such an arrangement provides advantages concerning heat conduction through the actuating portions 10. However, other solutions are also possible. For instance, in other embodiments, only a part of the internal electrode layers 12A-E extend of the entire electromechanical actuator 2, while others only extend over the actuating portions 10.

Figure 4A:
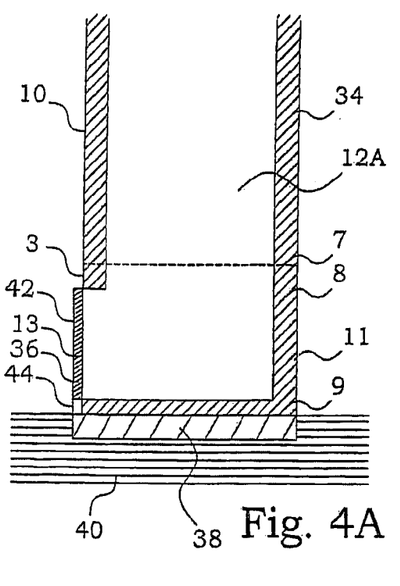
FIGS. 4A-F illustrates embodiments of internal electrode geometries according to the present invention.

FIGS. 4A-D illustrate different embodiments of the electrode geometries. FIG. 4A is a part of a cross section through an actuating portion 10 and a back portion 3 in the plane of an internal electrode 12A. Within the actuating portion 10, the internal electrode 12A is entirely surrounded by the electromechanically active material 34. However, at the back portion 3, the internal electrode 12A reaches a side surface 13. The appearance of internal electrode 12A at the surface of the back portion thereby forms a contacting portion 36, primarily intended for providing the electrical contact with the internal electrode 12A. Also surface electrodes, if any, may have contacting portions at the surface of the back portion 3. In the illustrated embodiment, a flexible printed circuit board 42 is attached to the contacting portion 36. The flexible printed circuit board 42 provides necessary circuitry for supplying voltage signals to the internal electrode 12A. The back portion 3 is in the illustrated embodiment supported by a housing 40. The housing 40 comprises a heat sink 38 arranged against the bottom side 9 of the back portion 3. By reducing the amount of electromechanically active material 34 below the internal electrode 12A, and preferably remove it entirely, a good heat conduction from the internal electrode to heat sink 38 is achieved. If the heat sink 38 is electrically conducting, an electrically insulating layer may have to be supplied between the internal electrode 12A and the heat sink or in any other part of the heat conduction path. Additional heat conduction may be provided by providing a heat conductor 44 between the contacting portion 36 and the heat sink.

Figure 4B:
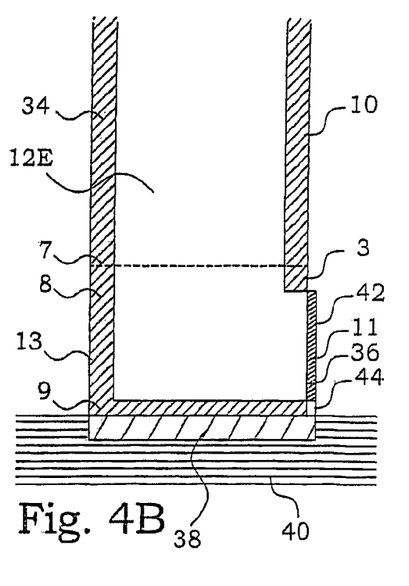

FIG. 4B illustrates a cross section at a ground internal electrode 12E of the same embodiment as illustrated in FIG. 4A. Also the ground internal electrode 12E is entirely surrounded by the electromechanically active material 34. However, at the back portion 3, the ground internal electrode 12E reaches the surface at an opposite side 11 compared to the internal electrode 12A of FIG. 4A. This makes it possible to provide electrical contacting to the ground internal electrodes 12E in a simple manner at the opposite side to the internal electrodes 12A. The heat removal arrangement is made in a corresponding manner.

Figure 4C:
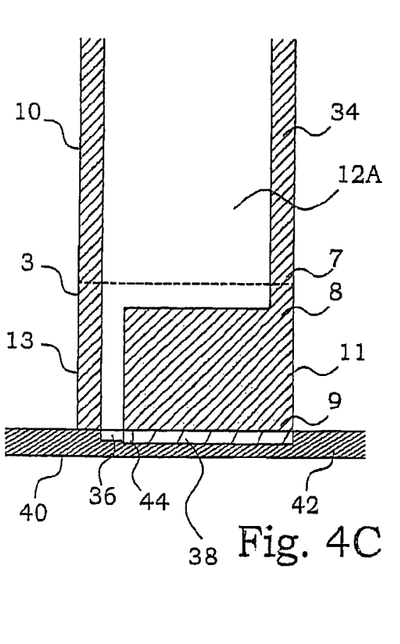

Contacting can be performed in many different configurations. FIG. 4C illustrates a part of a cross section through an actuating portion 10 and a back portion 3 in the plane of an internal electrode 12A for another embodiment. In this embodiment, the internal electrode 12A covers as large area as possible in the actuating portion 10, minimizing any inactive material 34 at the sides. However, at the back portion, where the geometrical situation is such that bendings or other motions are severely restricted, the internal electrode 12A is limited in area in order not to excite unnecessary material and thereby avoiding creation of unnecessary heat generation. In this way undesired bending of the back portion 3 can be avoided. The stiffness of the back portion will also increase since the modulus of elasticity is higher where there are no electrodes that control the electric field. However, reducing the area of the electrode 12A will also reduce the heat transportation capability, and a trade-off has to be performed between heat conduction and unnecessary excitation.

The internal electrode is in the present embodiment allowed to reach the surface at the bottom side 9 of the back portion 3, whereby a contacting portion 36 is formed. The housing 40 is in this embodiment constituted by a flexible printed circuit board 42, on which electrical circuitry for the excitation of the internal electrode 12A as well as heat transportation means 38 are provided.

Figure 4D:
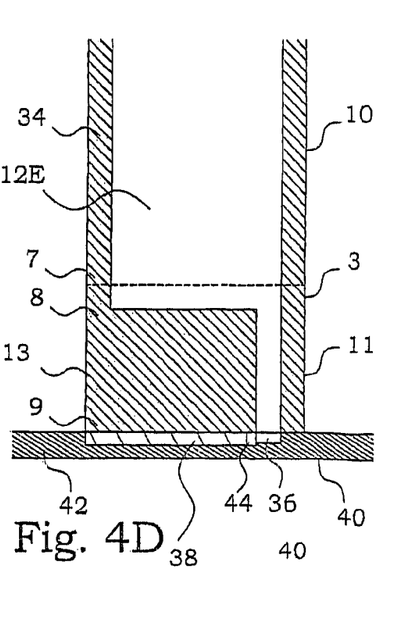

In FIG. 4D, corresponding ground internal electrode 12E is illustrated. Also this electrode has its contacting portion 36 at the bottom side 9 of the back portion 3. This means that mechanical, electrical and heat connections can be performed by just attach the electromechanical actuator 2 to the flexible printed circuit board 38. Furthermore, all outer surfaces of the electromechanical actuator 2 exhibit only electromechanical material, which is inherently insulating as well as chemically resistant. Additional manufacturing steps, such as e.g. passivation, may therefore be omitted.

Figure 4E:
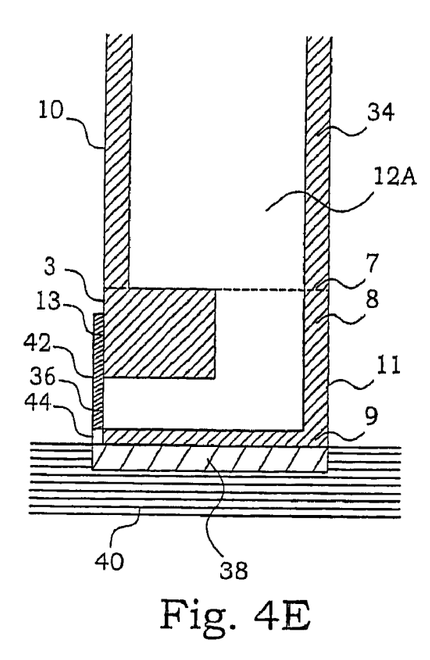
Figure 4F:
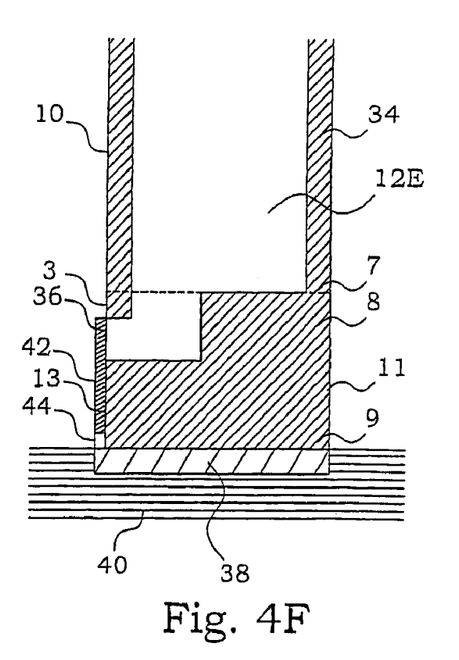

FIGS. 4E and 4F illustrate another embodiment. In the embodiment of FIG. 4E the internal electrode 12A reaches the side surface 13 at a limited portion of the back portion 3, thereby providing a smaller contacting portion 36 as compared with e.g. FIG. 4A. In FIG. 4F, it can be seen that the ground internal electrode 12E in a similar fashion has a contacting portion 36. By this configuration, contacting of the internal electrode 12A as well as contacting of the ground internal electrode 12E can be performed at the side surface 13 of the back portion 3, e.g. by a single flexible printed circuit board 42. Also here, the overlap between the electrodes 12A and 12E in the back portion 3 is minimized in order to make the back portion 3 stiffer and avoiding bending in the back portion 3. However, the electrodes might overlap a small distance into the back portion 3 to improve the stroke of the actuator portions 10.

The electrode shape and position in the actuating portion 10 could be varied in many different ways. By an intentional displacement of some of the electrode layers in a direction perpendicular to the first direction 15 the bending of the actuator portion 10 could be made in a direction that is not entirely parallel with direction 15. This is for instance advantageous when the electromechanical actuator 2 is used to drive a rotating disc. The electrodes could also have a width that varies along the longitudinal direction of the actuating portion 10 and some of the individual layers might be different than others. In particular cases also a bending in a direction that is orthogonal to the first direction 15 is desired. This could be accomplished by splitting an electrode into two different electrodes and drive these electrodes with different electrical signals.

From the above description, it is obvious that the configuration of the internal electrodes along the main extension direction of the actuating portions opens up for a very efficient heat transport from the electromechanical material to any housing having heat sink means. Provision of such heat conduction paths is far more complicated in cases where internal electrodes are provided perpendicular to the main extension direction of the actuating portions. This means that the operating frequency and/or voltage potentially can be increased in devices according to the present invention. The somewhat inefficient utilization of the electromechanical effects, e.g. the piezoelectric effect, by using the d31 excitation, can thereby further be compensated by operating the device at higher voltages and/or at higher frequencies. More heat will be generated in the actuator. However, the internal electrode configuration of the present invention allows for efficient heat conduction and the temperature of the actuator can thereby safely be kept below the Curie temperature.

The present invention is particularly beneficial when applied in very small size motors. The ratio between the dead zones and the useful electromechanical material will be high when the total dimensions are small. By utilizing the present invention, it opens up possibilities for further reduction of the motor size. Actuator sizes below 1 mm would e.g. be possible to achieve.

In the connection with motor size, the planarity and roughness of the body to be moved in relation to the actuator may be considered. A smaller distance between the "legs" of an actuator reduces the constraints on the accuracy of planarity of the body. However, even if the actuator legs are relatively broad, this knowledge can be utilized to increase angle tolerances during mounting.

There are also other benefits with a smaller distance between the drive pads. One important case is when a motor consists of only two legs and the movement is made by a dynamic walking mode. For instance a motor that is pressed against the body to be moved can make walking movements if the inertia of the body or stator/motor housing is large enough. With a reduced distance between the legs the walking frequency can be reduced, or alternatively, the inertia of the components can be lower.

The particular embodiments illustrated in the present invention illustrate motors and actuators that are particularly useful for stepping or walking motion mechanisms. However, the principles of the present invention may also, as indicated here above, be applied also to other types of driving mechanisms, such as, but not limited to, inertia-based mechanisms, e.g. stick-slip principles, or resonance-based mechanisms.

Figure 5A:
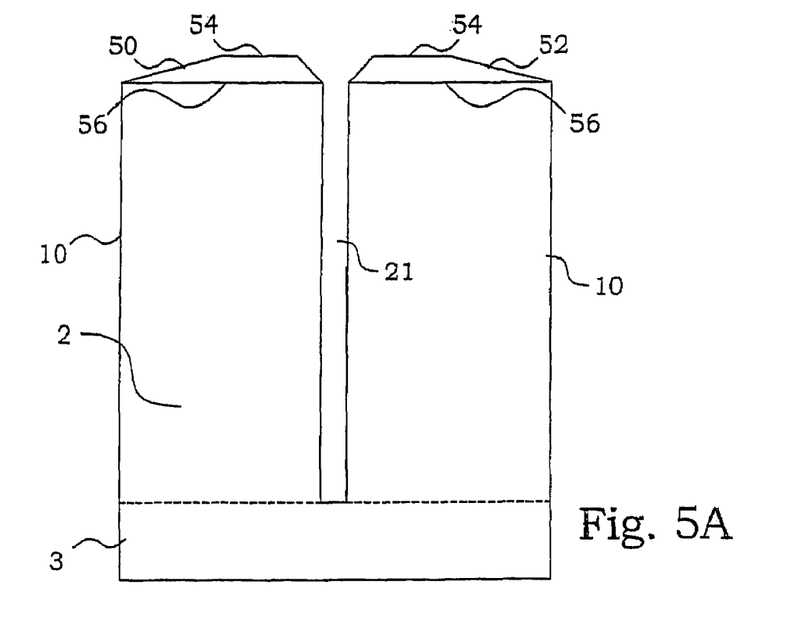
FIGS. 5A-B illustrate electromechanical actuators provided with asymmetric drive pads.
Figure 5B:
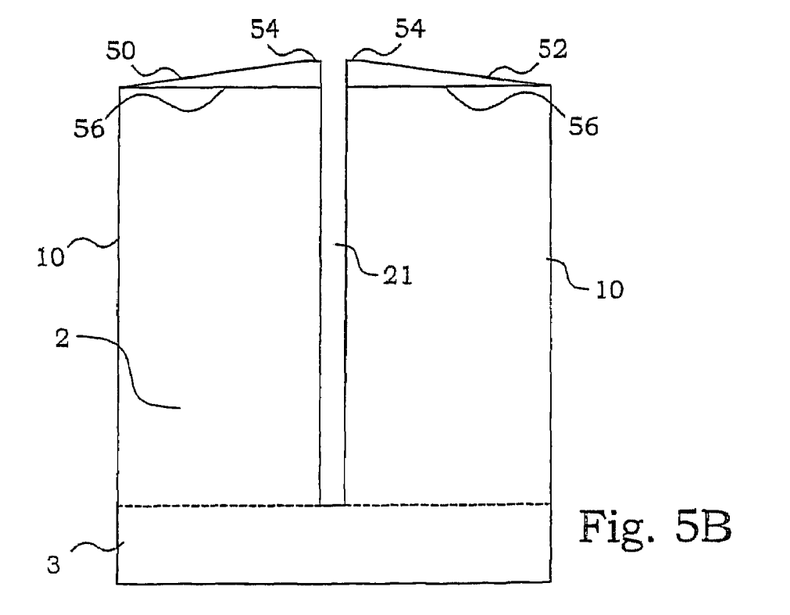

FIG. 5A illustrates a top part of an embodiment of an electromechanical actuator 2. At each top end 6, a drive pad 50, 52 is attached. The drive pad 50, 52 serves for giving the electromechanical actuator 2 proper elasticity and wear resistance relative to the body to be moved. In the present embodiment, the drive pads 50, 52 are shaped with a reduced contact area 54 against the body to be moved, compared to the top part of the electromechanical material 56. Furthermore, the drive pads 50, 52 are asymmetric with respect to the main actuating portion 10 and preferably reversed relative each other. In such a way, the apparent distance between the "legs" of the actuator 2 may be adapted to any requested distance. In the present embodiment, the apparent distance is about half the distance between the center lines of each actuating portion. In FIG. 5B, an even more extreme situation is presented, where the apparent distance is in the same order of magnitude as the slit 21 between the actuating portions 10. The disadvantage with such asymmetric arrangements is that the motion pattern of the drive pad tips becomes somewhat more complex and less controllable.

In a preferred manufacturing procedure, in particular intended for mass production, the slit 21 between the actuating portions 10 was produced by encapsulation of a volume of sacrificial material in the green ceramic state of the common body of the actuating portions 10 and back portion 3. Layers of sacrificial material can be screen printed onto the green ceramic state of one of the actuating portions 10. The ceramic layers building the other actuating portion was thereafter cast on top of the sacrificial material. To transfer the material from the green ceramic state to a functional piezoceramic actuator, the green state actuator was placed in a furnace and the polymer binder of the ceramic parts and the sacrificial material were burned out at an intermediate temperature, e.g. at 500-600° C. in a nitrogen rich atmosphere. A final sintering could then be performed at a higher temperature, e.g. in air atmosphere at about 1300° C.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

REFERENCES

US patent application 2005/0179343
German patent DE 44 08 618
U.S. Pat. No. 6,066,911
M. Bexell et al. "Characteristics of a piezoelectric miniature motor", in Sensors and Actuators 75 (1999) pp. 118-130.

The invention claimed is:
1. Electromechanical actuator, comprising:
a back portion;
at least two separate actuating portions of electromechanically active material, having a generally elongated shape;
said electromechanically active material as such presenting a shape change when an electrical field being applied over said electromechanically active material;
said at least two actuating portions being attached by a first end to a first side of said back portion, positioned parallel to each other one after the other in a first direction, forming a single common piece;
said first direction being transverse to said generally elongated shape;
internal electrode layers arranged inside said electromechanically active material for applying of said electrical field over said electromechanically active material for activating said electromechanically active material in a bimorph structure;
said bimorph structure enabling a second end of said actuating portions, opposite of said first end, to move along said first direction as well as along the elongated extension of said actuating portions;
said internal electrode layers having a generally flat two-dimensional shape directed substantially perpendicular to said first direction; and
means for transporting by heat conduction, heat generated within said electromechanically active material during said shape changes to an outer surface of said back portion;
said means for transporting comprising said internal electrode layers extending continuously over a major part of said actuating portion and into the back portion, thereby creating continuous heat paths through the actuating portion and back portion.

2. Electromechanical actuator according to claim 1, wherein at least one of said internal electrode layers extends over essentially the entire distance between said second end of said at least two actuating portions and a second side of said back portion, opposite of said first side.

3. Electromechanical actuator according to claim 1, wherein said internal electrode layers, within said at least two actuating portions, are entirely surrounded by said electromechanically active material.

4. Electromechanical actuator according to claim 3, wherein an outermost of said internal electrode layers is covered by a surface layer of electromechanically active material having a thickness of below 100 micrometers.

5. Electromechanical actuator according to claim 1, further comprising surface electrode layers for activating said electromechanically active material, provided at surfaces of said at least two actuating portions.

6. Electromechanical actuator according to claim 1, wherein said internal and/or surface electrode layers form contacting portions at a surface of said back portion.

7. Electromechanical actuator according to claim 6, wherein at least one of said contacting portions is provided at said second side of said back portion.

8. Electromechanical actuator according to claim 6, wherein at least one of said contacting portions is provided at a surface different from said second side of said back portion.

9. Electromechanical actuator according to claim 6, wherein at least one of said contacting portions is arranged in thermal contact with a heat conductor.

10. Electromechanical actuator according to claim 1, further comprising drive pads attached at said first end of said at least two actuating portions.

11. Electromechanical actuator according to claim 10, wherein said drive pads are asymmetric with respect to said first end of said at least two actuating portions.

12. Electromechanical motor, comprising:
an electromechanical actuator, having:
a back portion;
at least two separate actuating portions of electromechanically active material, having a generally elongated shape;
said electromechanically active material as such presenting a shape change when an electrical field being applied over said electromechanically active material;
said at least two actuating portions being attached by a first end to a first side of said back portion, positioned parallel to each other one after the other in a first direction, forming a single common piece;
said first direction being transverse to said generally elongated shape;

internal electrode layers arranged inside said electromechanically active material for applying of said electrical field over said electromechanically active material for activating said electromechanically active material in a bimorph structure;

said bimorph structure enabling a second end of said actuating portions, opposite of said first end, to move along said first direction as well as along the elongated extension of said actuating portions;

said internal electrode layers having a generally flat two-dimensional shape directed substantially perpendicular to said first direction; and means for transporting by heat conduction, heat generated within said electromechanically active material during said shape changes to an outer surface of said back portion;

said means for transporting comprising said internal electrode layers extending continuously over a major part of said actuating portion and into the back portion, thereby creating continuous heat paths through the actuating portion and back portion;

a body to be moved, arranged in mechanical contact with said electromechanical actuator; and control electronics, connected to said electromechanical actuator for supplying electrical signals for activation of said electromechanically active material.

13. Electromechanical actuator according to claim 1, wherein the electromechanically active material of said at least two actuating portions of electromechanically active material, having a generally elongated shape, is piezoelectric material.

14. Electromechanical motor according to claim 12, wherein the electromechanically active material of said at least two actuating portions of electromechanically active material, having a generally elongated shape, is piezoelectric material.

* * * * *